(12) United States Patent
Lee (10) Patent No.: US 9,166,572 B2
(45) Date of Patent: Oct. 20, 2015

(54) SEMICONDUCTOR DEVICE, SEMICONDUCTOR SYSTEM INCLUDING THE SEMICONDUCTOR DEVICE, AND METHOD FOR DRIVING THE SEMICONDUCTOR SYSTEM

(71) Applicant: SK hynix Inc., Gyeonggi-do (KR)

(72) Inventor: Hyun-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 286 days.

(21) Appl. No.: 14/019,149

(22) Filed: Sep. 5, 2013

(65) Prior Publication Data
US 2014/0312930 A1    Oct. 23, 2014

(30) Foreign Application Priority Data

Apr. 22, 2013    (KR) .......................... 10-2013-0044319

(51) Int. Cl.
*G06F 7/38*     (2006.01)
*H03K 5/00*    (2006.01)

(52) U.S. Cl.
CPC ...................................... *H03K 5/00* (2013.01)

(58) Field of Classification Search
None
See application file for complete search history.

(56) References Cited

U.S. PATENT DOCUMENTS

| 6,509,758 | B2 * | 1/2003 | Piasecki et al. ................. 326/37 |
| 7,202,701 | B1 * | 4/2007 | Chambers ....................... 326/82 |
| 7,492,185 | B1 | 2/2009 | Huang et al. |
| 2008/0005493 | A1 * | 1/2008 | Chung et al. .................. 711/149 |
| 2012/0284590 | A1 * | 11/2012 | Ku ................. 714/807 |
| 2013/0033916 | A1 * | 2/2013 | Oishi et al. ..................... 365/63 |

* cited by examiner

*Primary Examiner* — Cassandra Cox
(74) *Attorney, Agent, or Firm* — IP & T Group LLP (57) ABSTRACT

A semiconductor device includes a plurality of pads, a plurality of data input/output units connected with the plurality of pads and enabled in response to a plurality of enable signals, and a group programming unit suitable for grouping the plurality of pads into a number of pad groups in response to a mode register set (MRS) code and group information, and generating a number of groups of enable signals corresponding to the number of pad groups, wherein a number of groups of the data input/output units are sequentially enabled in response to respective groups of the enable signals.

20 Claims, 8 Drawing Sheets

SEMICONDUCTOR DEVICE, SEMICONDUCTOR SYSTEM INCLUDING THE SEMICONDUCTOR DEVICE, AND METHOD FOR DRIVING THE SEMICONDUCTOR SYSTEM

CROSS-REFERENCE TO RELATED APPLICATIONS

The present application claims priority of Korean Patent Application No. 10-2013-0044319, flied on Apr. 22, 2013, which is incorporated herein by reference in its entirety.

BACKGROUND

1. Field

Exemplary embodiments of the present invention relate to a semiconductor design technology, and more particularly, to a semiconductor device, a semiconductor system including the semiconductor device and a method for driving the semiconductor system.

2. Description of the Related Art

In general, a semiconductor device includes a data input/output unit for stable data input/output operations. The data input/output unit plays the role of converting externally inputted data into a signal suitable for internal circumstances and converting internally outputted data into a signal suitable for external circumstances.

Figure 1:
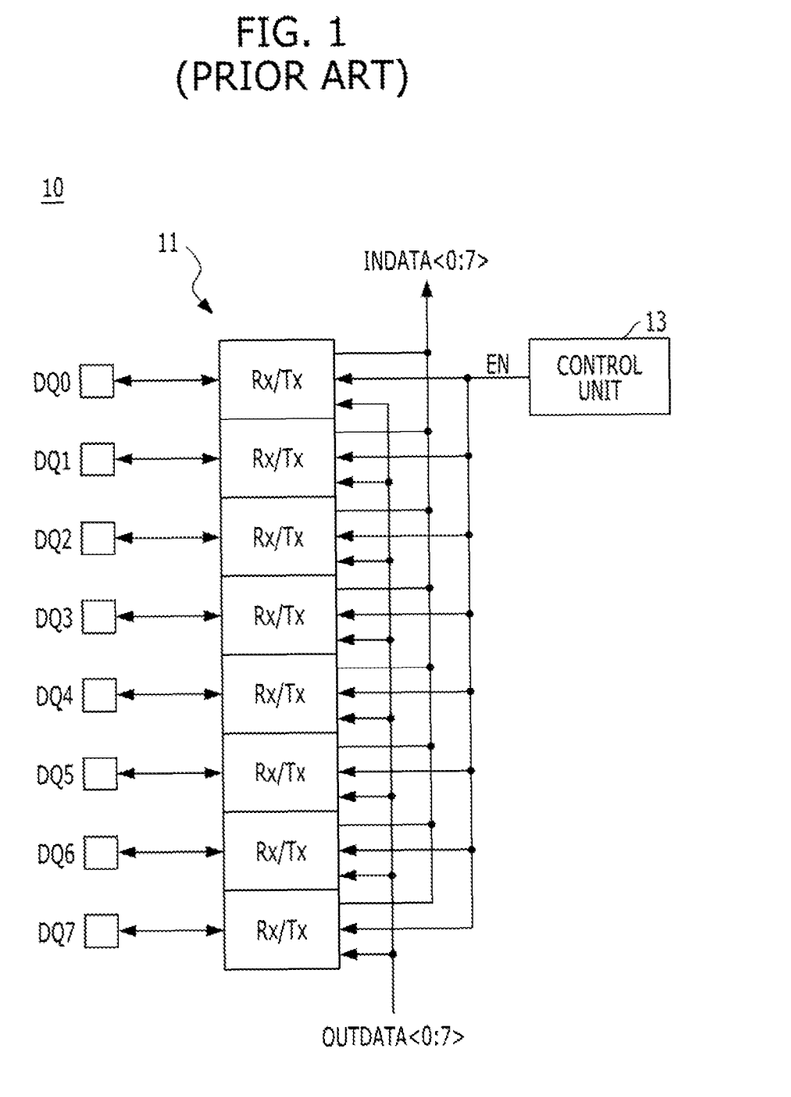
FIG. 1 is a block diagram of a conventional semiconductor device.

FIG. 1 is a block diagram of a conventional semiconductor device.

Referring to FIG. 1, a semiconductor device 10 includes a plurality of pads DQ0 to DQ7 which are connected with an external controller (not shown), a plurality of data input/output units 11 which are one-to-one connected with the plurality of pads DQ0 to DQ7 and exchange a plurality of data INDATA<0:7> and OUTDATA<0:7> with the external controller through the plurality of pads DQ0 to DQ7, and a control unit 13 configured to generate a common enable signal EN for enabling the plurality of data input/output units 11.

Operations of the semiconductor device 10 will be described below.

When the control unit 13 activates the common enable signal EN, the plurality of data input/output units 11 are simultaneously enabled and simultaneously input/output the plurality of data INDATA<0:7> and OUTDATA<0:7> through the plurality of pads DQ0 to DQ7.

However, in such the semiconductor device 10, a concern may be caused in that crosstalk is likely to occur between the data inputted/outputted through adjacent pads among the plurality of pads DQ0 to DQ7. Crosstalk means a signal interference phenomenon that occurs between channels. In particular, crosstalk may occur when signals transition.

Moreover, in the semiconductor device 10, because the plurality of data input/output units 11 are simultaneously controlled by the common enable signal EN, unnecessary power consumption may result when inputting/outputting data through partial pads of the plurality of pads DQ0 to DQ7.

SUMMARY

Various exemplary embodiments are directed to a semiconductor device in which crosstalk is minimized when inputting/outputting data, a semiconductor system including the semiconductor device, and a method for driving the semiconductor system.

Also, various exemplary embodiments are directed to a semiconductor device in which crosstalk and power consumption is minimized when inputting/outputting data, a semiconductor system including the semiconductor device, and a method for driving the semiconductor system.

In accordance with an embodiment of the present invention, a semiconductor device includes a plurality of pads, a plurality of data input/output units connected with the plurality of pads and enabled in response to a plurality of enable signals, and a group programming unit suitable for grouping the plurality of pads into a number of pad groups in response to a mode register set (MRS) code and group information, and generating a number of groups of the enable signals corresponding to the number of pad groups wherein a number of groups of the data input/output units are sequentially enabled in response to respective groups of the enable signals.

In accordance with another embodiment of the present invention, a semiconductor device includes a plurality of pads, a number of groups of data input/output units one-to-one connected with the plurality of pads and enabled by a plurality of buffer enable signals, a decoder suitable for decoding a predetermined mode register set (MRS) code and an address and generate latch enable signals and a select signal, a number of latch groups suitable for latching different group information in response to the number of groups of the latch enable signals, and a plurality of multiplexers suitable for selecting the group information respectively latched by the number of latch groups, according to the select signal, and outputting the plurality of buffer enable signals, wherein a number of groups of the data input/output units are enabled in response to respective groups of the buffer enable signals.

In accordance with still another embodiment of the present invention, a semiconductor device includes a plurality of pads, an input circuit suitable for transferring a plurality of data inputted through the plurality of pads to internal circuits, wherein each part of the data among a number of parts of the data for respective pad groups are transferred at a different time from the other pad groups in response to delay codes and a clock, and a group programming unit suitable for grouping the plurality of pads into a number of the pad groups in response to a mode register set (MRS) code and group information, and generating a number of groups of the delay codes corresponding to the number of groups. Each part of the data may be sequentially inputted with a predetermined time interval.

In accordance with still another embodiment of the present invention, a semiconductor device includes: a plurality of pads; a plurality of input sections suitable for transferring a plurality of data inputted through the plurality of pads to internal circuits, wherein each part of the data among a number of parts of data for respective pad groups are transferred at a different time from the other pad groups at different times in response to a plurality of delayed clocks, a decoder suitable for decoding a predetermined mode register set (MRS) code and an address and generating a number of latch enable signals, a number of latch groups suitable for latching different group information for the respective pad groups in response to the number of the latch enable signals; and a plurality of delay sections suitable for delaying delay a clock by different delay times for the respective pad groups in response to respective delay codes which are outputted from the number of latch groups, and output the plurality of delayed clocks. Each part of the data may be inputted sequentially with a predetermined time interval.

In accordance with still another embodiment of the present invention, a semiconductor system includes a controller, and a semiconductor device suitable for grouping a plurality of pads disposed therein into a number of pad groups under control of the controller in a program mode, and exchanging data with the controller through any one pad group at a different transmission time from the other pad groups in a normal mode.

The controller may provide information signals for grouping the plurality of pads to the semiconductor device in the program mode, and input/output the data through channels corresponding to the respective pad groups in the normal mode.

The semiconductor device may enable input/output units corresponding to any one of the pad groups at a time among a plurality of input/output units which are one-to-one connected with the plurality of pads, in the normal mode.

Each of the pad groups may include non-adjacent pads among the plurality of pads.

In accordance with still another embodiment of the present invention, a semiconductor system includes a controller, and a semiconductor device suitable for grouping a plurality of pads disposed therein into a number of pad groups under control of the controller in a program mode, and receiving/outputting a number of parts of data from/to the controller through the pads corresponding to respective pad groups with a predetermined time interval under control of the controller in a normal mode.

The controller may provide information signals for grouping the plurality of pads to the semiconductor device in the program mode, and input/output sequentially each part of the data through channels corresponding to the pad group in the normal mode.

In the normal mode, even when transmitting data through internal signal lines, the semiconductor device may transmit each part of the data corresponding to the pad group with the predetermined time interval.

Each of the pad groups may include non-adjacent pads among the plurality of pads.

In accordance with still another embodiment of the present invention, a method for driving a semiconductor system including a controller and a semiconductor device which exchanges data with the controller under control of the controller includes sequentially latching a plurality of group information which is sequentially transmitted from the controller and includes information for grouping a plurality of pads disposed in the semiconductor device into a number of pad groups, by a number of latch groups in the semiconductor device under control of the controller in a program mode, and enabling a plurality of input/output units one-to-one connected with the plurality of pads, based on the group information latched by respective latch groups in the semiconductor device under control of the controller in a normal mode.

In the normal mode, the controller and the semiconductor device may be inputted with or output each of a number of parts of data corresponding to the respective pad groups.

In accordance with still another embodiment of the present invention, a method for driving a semiconductor system including a controller and a semiconductor device which exchanges data with the controller under control of the controller includes sequentially latching a plurality of group information which is sequentially transmitted from the controller and includes information for grouping a plurality of pads disposed in the semiconductor device into a number of pad groups, by a number of latch groups in the semiconductor device under control of the controller in a program mode, and receiving/outputting a number of parts of data from/to the controller based on the basis of group information latched by the number of latch groups in the semiconductor device under control of the controller in a normal mode, wherein each part of data corresponding to the respective pad group is received/outputted at a different time from the other parts of data.

In accordance with the present invention, since data are inputted/outputted by pad groups, crosstalk may be minimized when inputting/outputting data.

Also, since whether to enable a plurality of data input/output units when inputting/outputting data is controlled by pad groups, power consumption may be minimized.

DETAILED DESCRIPTION

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In the following embodiments, it will be exemplarily described that a semiconductor device includes 8 pads and the 8 pads are grouped into 2 pad groups.

Figure 2:
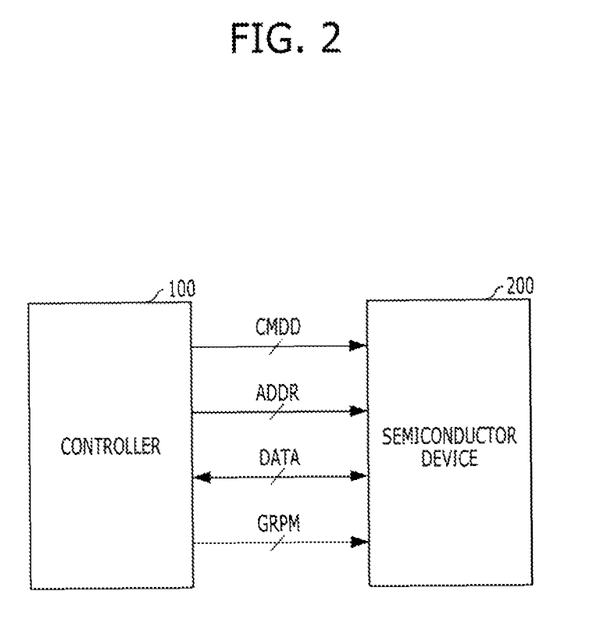
FIG. 2 is a block diagram showing a semiconductor system in accordance with an exemplary embodiment of the present invention.

FIG. 2 is a block diagram showing a semiconductor system in accordance with an exemplary embodiment of the present invention.

Referring to FIG. 2, the semiconductor system includes a controller 100, and a semiconductor device 200 configured to group 8 pads disposed therein into 2 pad groups under the control of the controller 100 in a program mode and exchange data DATA with the controller 100 through any one of the 2 pad groups in a normal mode.

The controller 100 provides information signals CMDD, ADDR and GRPM for pad grouping, to the semiconductor device 200 in the program mode, and exchanges the data DATA with the semiconductor device 200 through the channels corresponding to one pad group in the normal mode. The information signals CMDD, ADDR and GRPM include commands CMDD, addresses ADDR and group information GRPM. The controller 100 may provide the group information GRPM to the semiconductor device 200 through the channels used for inputting/outputting the data DATA.

Figure 3:
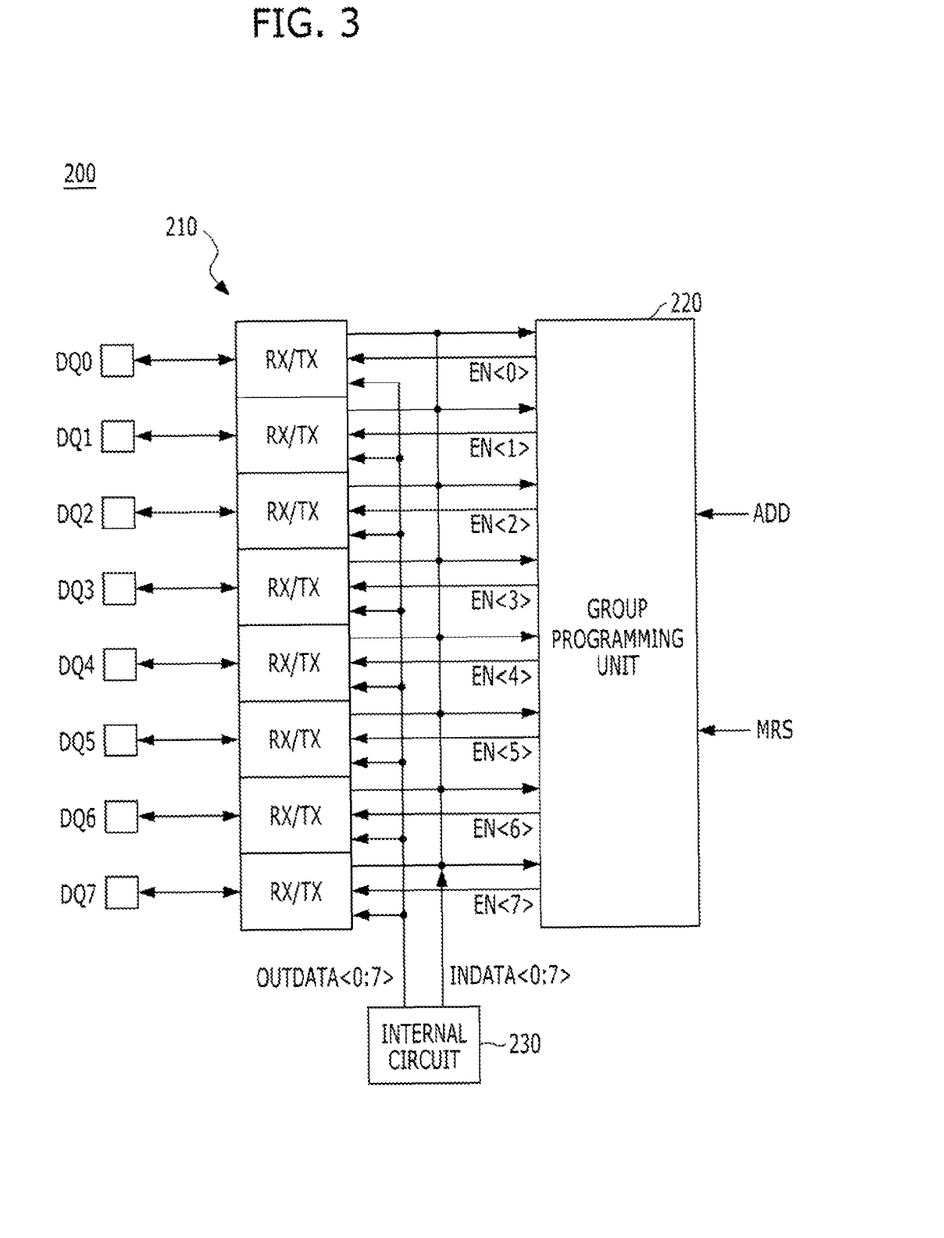
FIG. 3 is a block diagram of the semiconductor device shown in FIG. 2.

FIG. 3 is a block diagram of the semiconductor device 200 shown in FIG. 2.

Referring to FIG. 3, the semiconductor device 200 includes first to eighth pads DQ0 to DQ7, first to eighth data input/output units 210 one-to-one connected with the first to eighth pads DQ0 to DQ7 and configured to be respectively enabled by first to eighth buffer enable signals EN<0:7>, and a group programming unit 220 configured to group the first to eighth pads DQ0 to DQ7 into 2 pad groups in response to a mode register set (MRS) code MRS, a specific address ADD and group information INDATA<0:7> and generate the first to eighth buffer enable signals EN<0:7> in correspondence to the grouping result.

The first to eighth data input/output units 210 input/output first to eighth data INDATA<0:7> and OUTDATA<0:7> through the first to eighth pads DQ0 to DQ7 and internal circuit 230 in the normal mode, and transfer the group information GRPM inputted through the first to eighth pads DQ0 to DQ7, to the group programming unit 220 in the program mode.

Hereinbelow, the first to eighth data INDATA<0:7> and the group information GRPM will be described using the same reference symbol, i.e., 'INDATA<0:7>'. However, it is to be noted that, as described above, the signals DATA inputted through the first to eighth pads DQ0 to DQ7 in the normal mode are the first to eighth data INDATA<0:7> and the signals GRPM inputted through the first to eighth pads DQ0 to DQ7 in the program mode are the group information INDATA<0:7>. The group information INDATA<0:7> includes information for grouping the first to eighth pads DQ0 to DQ7 into a first pad group and a second pad group. For reference, the first group and the second pad group include pads which are not adjacent to one another among the first to eighth pads DQ0 to DQ7. For example, the first pad group includes odd-numbered pads DQ0, DQ2, DQ4 and DQ6 among the first to eighth pads DQ0 to DQ7, and the second pad group includes even-numbered pads DQ1, DQ3, DQ5 and DQ7 among the first to eighth pads DQ0 to DQ7.

Figure 4:
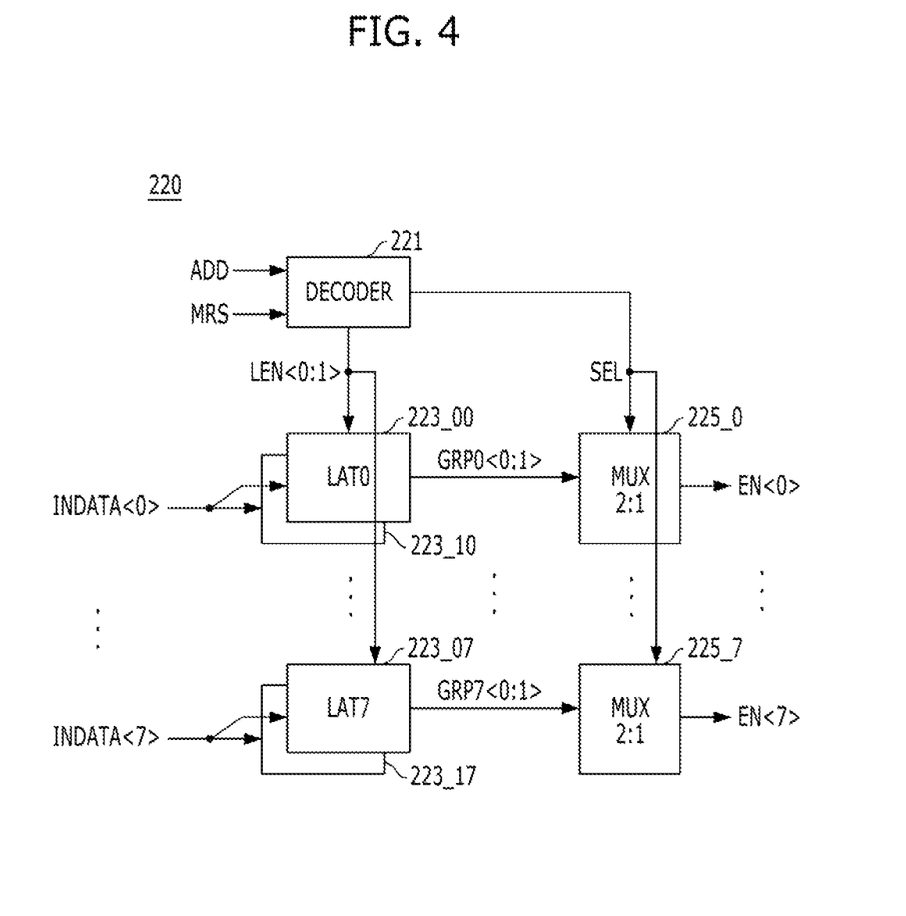
FIG. 4 is a circuit diagram of the group programming unit shown in FIG. 3.

FIG. 4 is a circuit diagram of the group programming unit 220 shown in FIG. 3.

Referring to FIG. 4, the group programming unit 220 includes a decoder 221 configured to decode the MRS code MRS and the specific address ADD and generate first and second latch enable signals LEN<0:1> and a select signal SEL, first and second latch groups 223_00 to 223_07 and 223_10 to 223_17 configured to latch different group information INDATA<0:7> in response to the first and second latch enable signals LEN<0:1>, and first to eighth multiplexers 225_0 to 225_7 configured to select any one of first and second group information GRP0<0> to GRP7<0> and GRP0<1> to GRP7<1> latched by the first and second latch groups 223_00 to 223_07 and 223_10 to 223_17 according to the select signal SEL and output the first to eighth buffer enable signals EN<0:7>.

The decoder 221 generates the first and second latch enable signals LEN<0:1> corresponding to the specific address ADD and the select signal SEL only in the case where the MRS code MRS is activated. The MRS code MRS may be generated by a combination of the command CMDD and the address ADDR provided from the controller 100, and the specific address ADD may be a signal which is included in the addresses ADDR. Since the decoder 221 is as generally known in the art, detailed descriptions thereof will be omitted herein.

The first and second latch groups 223_00 to 223_07 and 223_10 to 223_17 are selectively enabled in response to the first and second latch enable signals LEN<0:1> and selectively latch the group information INDATA<0:7> transferred through the first to eighth data input/output units 210. For example, the first latch group 223_00 to 223_07 latches the group information INDATA<0:7> transferred through the first to eighth data input/output units 210 in the case where the first latch enable signal LEN<0> is activated, and the second latch group 223_10 to 223_17 latches the group information INDATA<0:7> transferred through the first to eighth data input/output units 210 in the case where the second latch enable signal LEN<1> is enabled.

Each of the first to eighth multiplexers 225_0 to 225_7 has inputs corresponding to the number of latch groups. For instance, each of the first to eighth multiplexers 225_0 to 225_7 includes a 2:1 multiplexer which has 2 inputs in correspondence to the first and second latch groups 223_00 to 223_07 and 223_10 to 223_17.

Hereinafter, a method for driving the semiconductor system in accordance with the first embodiment, configured as mentioned above, will be described.

In this exemplary embodiment, operations according to the program mode and operations according to the normal mode will be divisionally described.

First, a procedure in which the first to eighth pads DQ0 to DQ7 are grouped into the first pad group DQ0, DQ2, DQ4 and DQ6 and the second pad group DQ1, DQ3, DQ5 and DQ7 according to the program mode will be described with reference to FIG. 5.

Figure 5:
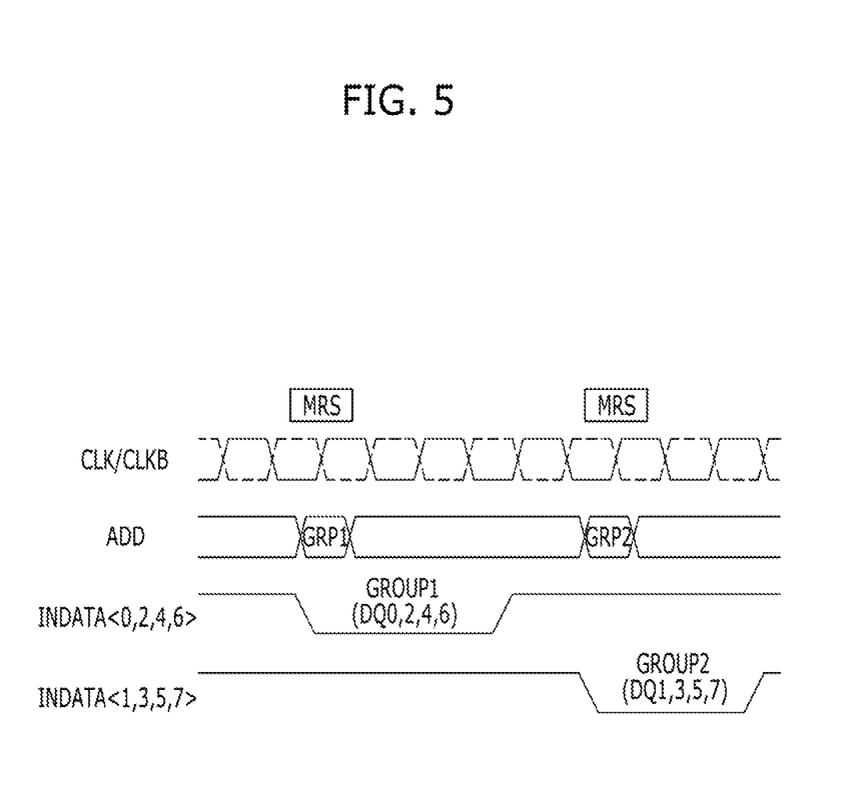
FIG. 5 is a timing diagram explaining a method for driving the semiconductor device illustrated in FIGS. 2 to 4.

FIG. 5 is a timing diagram explaining operations according to the program mode in a method for driving the semiconductor system illustrated in FIGS. 2 to 4.

Referring to FIG. 5, the controller 100 provides the information signals CMDD, ADDR and GRPM to the semiconductor device 200 at the program mode. The semiconductor device 200 performs a pad grouping operation in response to the information signals CMDD, ADDR and GRPM, and detailed contents thereof are as follows.

While not shown, if a predetermined MRS code MRS is generated in the semiconductor device 200 by a combination of the command CMDD and the address ADDR, the decoder 221 generates the first and second latch enable signals LEN<0:1> for selecting any one of the first and second latch groups 223_00 to 223_07 and 223_10 to 223_17, in response to the predetermined MRS code MRS and the specific address ADD. For example, if the predetermined MRS code MRS is activated and the specific address ADD for selecting the first latch group 223_00 to 223_07 is applied, the decoder 221 activates the first latch enable signal LEN<0>, or, if the predetermined MRS code MRS is activated and the specific address ADD for selecting the second latch group 223_10 to 223_17 is applied, the decoder 221 activates the second latch enable signal LEN<1>.

First, as the predetermined MRS code MRS is activated and the specific address ADD for selecting the first latch group 223_00 to 223_07 is inputted, the decoder 221 activates the first latch enable signal LEN<0>.

The first latch group 223_00 to 223_07 latches the group information INDATA<0:7> inputted through the first to eighth pads DQ0 to DQ7 and the first to eighth data input/output units 210. The group information INDATA<0:7> is information for grouping 4 pads together among the first to eighth pads DQ0 to DQ7, and pads inputted with signals of a predetermined logic level among the data signals included in the group information INDATA<0:7> are grouped together. For example, if the group information INDATA<0, 2, 4, 6> applied through the first pad DQ0, the third pad DQ2, the fifth pad DQ4 and the seventh pad DQ6 is a logic low level and the group information INDATA<1, 3, 5, 7> applied through the second pad DQ1, the fourth pad DQ3, the sixth pad DQ5 and the eighth pad DQ7 is a logic high level, the first pad DQ0, the third pad DQ2, the fifth pad DQ4 and the seventh pad DQ6 are grouped into the first pad group.

In succession, as the predetermined MRS code MRS is activated and the specific address ADD for selecting the second latch group 223_10 to 223_17 is inputted, the decoder 221 activates the second latch enable signal LEN<1>.

The second latch group 223_10 to 223_17 latches the group information INDATA<0:7> inputted through the first to eighth pads DQ0 to DQ7 and the first to eighth data input/output units 210. Pads inputted with signals of a predetermined logic level among the data signals included in the group information INDATA<0:7> are grouped together. For example, if the group information INDATA<0, 2, 4, 6> applied through the first pad DQ0, the third pad DQ2, the fifth pad DQ4 and the seventh pad DQ6 is a logic high level and the group information INDATA<1, 3, 5, 7> applied through the second pad DQ1, the fourth pad DQ3, the sixth pad DQ5 and the eighth pad DQ7 is a logic low level, the second pad DQ1, the fourth pad DQ3, the sixth pad DQ5 and the eighth pad DQ7 are grouped into the second pad group.

Summarizing these, in the program mode, the group information INDATA<0:7> applied at different times from the controller 100 in response to the predetermined MRS code MRS and the specific address ADD is latched by the first and second latch groups 223_00 to 223_07 and 223_10 to 223_17.

Next, a procedure in which the first to eighth data INDATA<0:7> and OUTDATA<0:7> are inputted/outputted according to the normal mode will be described below.

While not shown, if the controller 100 transmits the data DATA simultaneously through the channels corresponding to the first pad group DQ0, DQ2, DQ4 and DQ6, the first to eighth multiplexers 225_0 to 225_7 select the first group information GRP0<0> to GRP7<0> latched by the first latch group 223_00 to 223_07 under the control of the decoder 221, and output the first to eighth buffer enable signals EN<0:7>. The decoder 221 may operate under the control of the controller 100.

Then, the first, third, fifth and seventh data input/output units 210 corresponding to the first pad group DQ0, DQ2, DQ4 and DQ6 among the first to eighth data input/output units 210 are enabled and perform data input/output operations, and the second, fourth, sixth and eighth data input/output units 210 corresponding to the second pad group DQ1, DQ3, DQ5 and DQ7 are disabled.

If external data are inputted through the second pad group DQ1, DQ3, DQ5 and DQ7, the first to eighth multiplexers 225_0 to 225_7 select the second group information GRP0<1> to GRP7<1> latched by the second latch group 223_10 to 223_17 under the control of the decoder 221, and output the first to eighth buffer enable signals EN<0:7>.

Then, the second, fourth, sixth and eighth data input/output units 210 corresponding to the second pad group DQ1, DQ3, DQ5 and DQ7 among the first to eighth data input/output units 210 are enabled and perform data input/output operations, and the first, third, fifth and seventh data input/output units 210 corresponding to the first pad group DQ0, DQ2, DQ4 and DQ6 are disabled.

Summarizing these, in the normal mode, any one of the first and second group information GRP0<0> to GRP7<0> and GRP0<1> to GRP7<1> latched by the first and second latch groups 223_00 to 223_07 and 223_10 to 223_17 according to the MRS code MRS and the specific address ADD is selected as the first to eighth buffer enable signals EN<0:7>, and the first to eighth data input/output units 210 are enabled by the pad groups in response to the first to eighth buffer enable signals EN<0:7> and perform the data input/output operations.

According to the first embodiment, since data are simultaneously inputted/outputted by pad groups each including nonadjacent pads, crosstalk between inputted/outputted data may be minimized, and, since unused data input/output units are disabled, unnecessary power consumption may be prevented.

Figure 6:
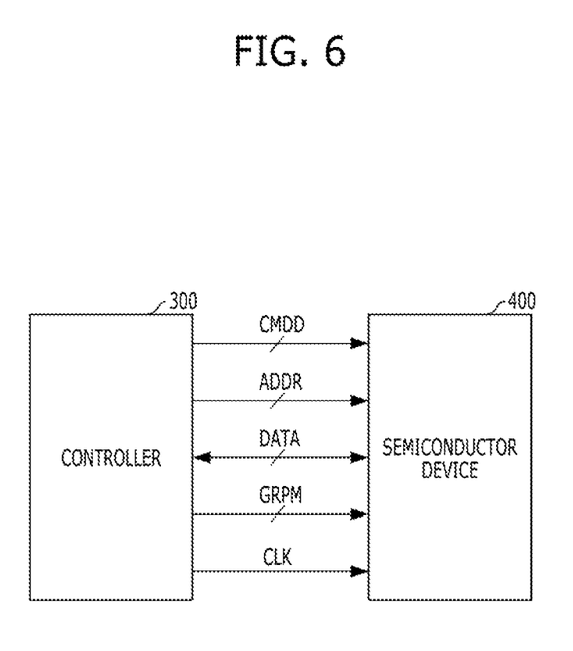
FIG. 6 is a block diagram showing a semiconductor system in accordance with another exemplary embodiment of the present invention.

FIG. 6 is a block diagram showing a semiconductor system in accordance with another exemplary embodiment of the present invention.

Referring to FIG. 6, a semiconductor system includes a controller 300, and a semiconductor device 400 configured to group 8 pads disposed therein into 2 pad groups under the control of the controller 300 in a program mode. Two parts of data DATA are sequentially inputted to the semiconductor device 400 from the controller 300 or two parts of data DATA are sequentially outputted from the semiconductor device 400 to the controller 300 through the pad groups wherein each part of the data DATA is outputted/inputted through a corresponding pad group with a predetermined transmission time different from the other group under the control of the controller 300 in a normal mode.

The controller 300 provides information signals CMDD, ADDR, GRPM and CLK for pad grouping, to the semiconductor device 400 in the program mode, and is inputted with or outputs the data DATA sequentially by the pad groups through the channels corresponding to the pad groups in the normal mode. The information signals CMDD, ADDR, GRPM and CLK include commands CMDD, addresses ADDR, group information GRPM and a clock CLK. The controller 300 may provide the group information GRPM to the semiconductor device 400 through the channels used for inputting/outputting the data DATA.

Figure 7:
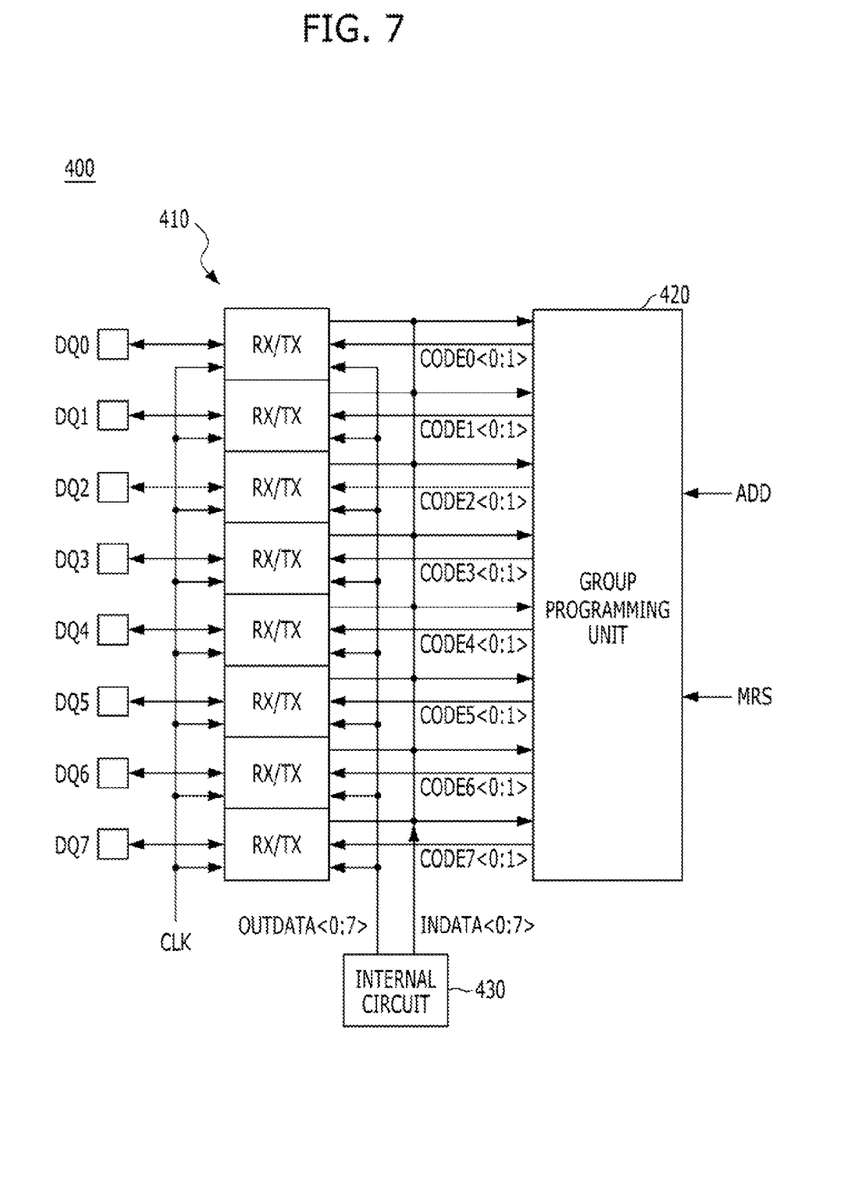
FIG. 7 is a block diagram of the semiconductor device shown in FIG. 6.

FIG. 7 is a block diagram of the semiconductor device 400 shown in FIG. 6.

Referring to FIG. 7, the semiconductor device 400 includes first to eighth pads DQ0 to DQ7, first to eighth data input/output units 410 one-to-one connected with the first to eighth pads DQ0 to DQ7, and a group programming unit 420. The first to eighth data input/output units transfer the data DATA applied from the controller 300 through the first to eighth pads DQ0 to DQ7 to internal circuits 430. Two parts of data DATA are transferred at different times for the respective pad groups in response to first to eighth delay codes CODE0<0:1> to CODE7<0:1> in the normal mode. The group programming unit 420 serves to group the first to eighth pads DQ0 to DQ7 into 2 pad groups in response to a predetermined MRS code MRS, a specific address ADD and group information INDATA<0:7> in the program mode and generate the first to eighth delay codes CODE0<0:1> to CODE7<0:1> in correspondence to the grouping result.

Since the first to eighth data INDATA<0:7> and the group information INDATA<0:7> are signals which are inputted through the first to eighth pads DQ0 to DQ7, they will be described using the same reference numeral. However, it is to be noted that, as described above, the signals DATA inputted through the first to eighth pads DQ0 to DQ7 in the normal mode are the first to eighth data INDATA<0:7> and the signals GRPM inputted through the first to eighth pads DQ0 to DQ7 in the program mode are the group information INDATA<0:7>. The group information INDATA<0:7> includes information for grouping the first to eighth pads DQ0 to DQ7 into the 2 pad groups. The pad groups include pads which are not adjacent to one another among the first to eighth pads DQ0 to DQ7. For example, the first pad group includes odd-numbered pads DQ0, DQ2, DQ4 and DQ6 among the first to eighth pads DQ0 to DQ7, and the second pad group includes even-numbered pads DQ1, DQ3, DQ5 and DQ7 among the first to eighth pads DQ0 to DQ7.

Figure 8:
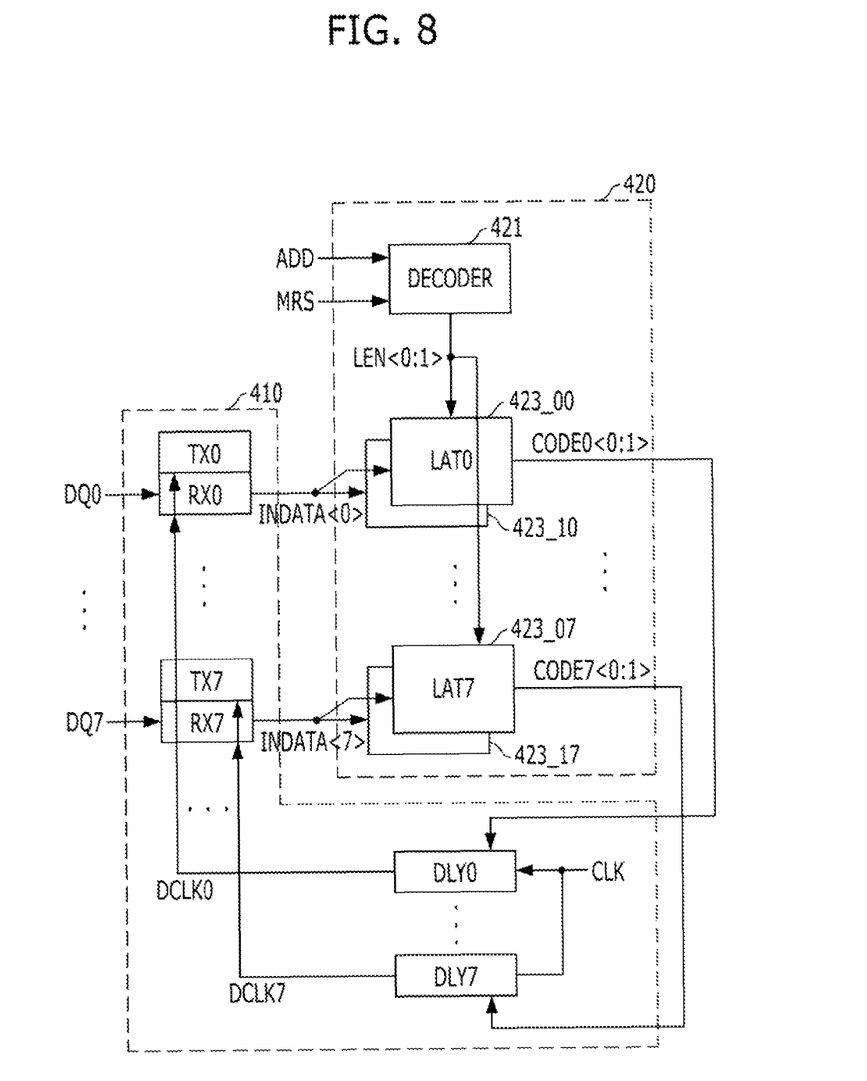
FIG. 8 is a circuit diagram of the data input/output units and the group programming unit shown in FIG. 7.

FIG. 8 is a circuit diagram of the first to eighth data input/output units 410 and the group programming unit 420 shown in FIG. 7.

Referring to FIG. 8, the first to eighth data input/output units 410 include first to eighth delay sections DLY0 to DLY7 configured to delay the clock CLK by different delay times for the respective pad groups in response to the first to eighth delay codes CODE0<0:1> to CODE7<0:1> and output first to eighth delayed clocks DCLK0 to DCLK7, first to eighth input sections RX0 to RX7 configured to transfer the first to eighth data INDATA<0:7> inputted through the first to eighth pads DQ0 to DQ7, to the internal circuits at different times for the respective pad groups in response to the first to eighth delayed clocks DCLK0 to DCLK7, and first to eighth output sections TX0 to TX7 configured to output first to eighth internal data OUTDATA<0:7> transferred from the Internal circuits, to the first to eighth pads DQ0 to DQ7 at different times for the respective pad groups in response to the first to eighth delayed clocks DCLK0 to DCLK7.

The group programming unit 420 includes a decoder 421 configured to decode the MRS code MRS and the specific address ADD and generate first and second latch enable signals LEN<0:1>, and first and second latch groups 423_00 to 423_07 and 423_10 to 423_17 configured to latch different group information INDATA<0:7> for the respective pad groups in response to the first and second latch enable signals LEN<0:1> and output the first to eighth delay codes CODE0<0:1> to CODE7<0:1>.

The decoder 421 generates the first and second latch enable signals LEN<0:1> corresponding to the specific address ADD only in the case where the MRS code MRS is activated. The MRS code MRS may be generated by a combination of the command CMDD and the address ADDR provided from the controller 300, and the specific address ADD may be a signal which is included in the addresses ADDR. Since the decoder 421 is as generally known in the art, detailed descriptions thereof will be omitted herein.

The first and second latch groups 423_00 to 423_07 and 423_10 to 423_17 are designed to receive the group information INDATA<0:7> by the unit of a latch group and output the first to eighth delay codes CODE0<0:1> to CODE7<0:1> by the unit of a pair of latches. For example, the first latch group 423_00 to 423_07 latches the group information INDATA<0: 7> transferred through the first to eighth input sections RX0 to RX7 in the case where the first latch enable signal LEN<0> is activated, and the second latch group 423_10 to 423_17 latches the group information INDATA<0:7> transferred through the first to eighth input sections RX0 to RX7 in the case where the second latch enable signal LEN<1> is activated. Further, among first to eighth latches LAT0 to LAT7 included in each of the first and second latch groups 423_00 to 423_07 and 423_10 to 423_17, the output signals of two first latches LAT0 corresponding to the first input section RX0 are generated as the first delay codes CODE0<0:1>, the output signals of two second latches LAT1 corresponding to the second input section RX1 are generated as the second delay codes CODE1<0:1>, the output signals of two third latches LAT2 corresponding to the third input section RX2 are generated as the third delay codes CODE2<0:1>, the output signals of two fourth latches LAT3 corresponding to the fourth input section RX3 are generated as the fourth delay codes CODE3<0:1>, the output signals of two fifth latches LAT4 corresponding to the fifth input section RX4 are generated as the fifth delay codes CODE4<0:1>, the output signals of two sixth latches LAT5 corresponding to the sixth input section RX5 are generated as the sixth delay codes CODE5<0:1>, the output signals of two seventh latches LAT6 corresponding to the seventh input section RX6 are generated as the seventh delay codes CODE6<0:1>, and the output signals of two eighth latches LAT7 corresponding to the eighth input section RX7 are generated as the eighth delay codes CODE7<0:1>.

Hereinafter, a method for driving the semiconductor system in accordance with the second embodiment, configured as mentioned above, will be described.

In the present embodiment, operations according to the program mode and operations according to the normal mode will be divisionally described.

First, a procedure in which the first to eighth pads DQ0 to DQ7 are grouped into the 2 pad groups DQ0, DQ2, DQ4 and DQ6, and DQ1, DQ3, DQ5 and DQ7 according to the program mode will be described.

The controller 300 provides the information signals CMDD, ADDR, GRPM and CLK to the semiconductor device 400 according to the program mode. The semiconductor device 400 performs a pad grouping operation in response to the information signals CMDD, ADDR, GRPM and CLK, and detailed contents thereof are as follows.

While not shown, if a predetermined MRS code MRS is generated in the semiconductor device 400 by a combination of the command CMDD and the address ADDR, the decoder 421 generates the first and second latch enable signals LEN<0:1> for selecting any one of the first and second latch groups 423_00 to 423_07 and 423_10 to 423_17, in response to the predetermined MRS code MRS and the specific address ADD. For example, if the predetermined MRS code MRS is activated and the specific address ADD for selecting the first latch group 423_00 to 423_07 is applied, the decoder 421 activates the first latch enable signal LEN<0>, or, if the predetermined MRS code MRS is activated and the specific address ADD for selecting the second latch group 423_10 to 423_17 is applied, the decoder 421 activates the second latch enable signal LEN<1>.

First, as the predetermined MRS code MRS is activated and the specific address ADD for selecting the first latch group 423_00 to 423_07 is inputted, the decoder 421 activates the first latch enable signal LEN<0>. The first latch group 423_00 to 423_07 latches the group information INDATA<0: 7> inputted through the first to eighth pads DQ0 to DQ7 and the first to eighth input sections RX0 to RX7. The group information INDATA<0:7> includes information for grouping the first to eighth pads DQ0 to DQ7 into the first and second pad groups DQ0, DQ2, DQ4 and DQ6, and DQ1, DQ3, DQ5 and DQ7.

In succession, as the predetermined MRS code MRS is activated and the specific address ADD for selecting the second latch group 423_10 to 423_17 is inputted, the decoder 421 activates the second latch enable signal LEN<1>. The second latch group 423_10 to 423_17 latches the group information INDATA<0:7> inputted through the first to eighth pads DQ0 to DQ7 and the first to eighth data input/output units 410.

Summarizing these, in the program mode, the group information INDATA<0:7> sequentially inputted by the unit of a latch group in response to the predetermined MRS code MRS and the specific address ADD is latched by the first and second latch groups 423_00 to 423_07 and 423_10 to 423_17.

Next, a procedure in which the first to eighth data INDATA<0:7> are inputted according to the normal mode will be described below.

The first to eighth delay sections DLY0 to DLY7 delay the clock CLK differently for the respective pad groups in response to the first to eighth delay codes CODE0<0:1> to CODE7<0:1> and generate the first to eighth delayed clocks DCLK0 to DCLK7. The first delay codes CODE0<0:1> use the information latched by the pair of first latches LAT0 among the latches LAT0 to LAT7 included in the respective first and second latch groups 423_10 to 423_17, the second delay codes CODE1<0:1> use the information latched by the pair of second latches LAT1 among the latches LAT0 to LAT7 included in the respective first and second latch groups 423_10 to 423_17, the third delay codes CODE2<0:1> use the information latched by the pair of third latches LAT2 among the latches LAT0 to LAT7 included in the respective first and second latch groups 423_10 to 423_17, the fourth delay codes CODE3<0:1> use the information latched by the pair of fourth latches LAT3 among the latches LAT0 to LAT7 included in the respective first and second latch groups 423_10 to 423_17, the fifth delay codes CODE4<0:1> use the information latched by the pair of fifth latches LAT4 among the latches LAT0 to LAT7 included in the respective first and second latch groups 423_10 to 423_17, the sixth delay codes CODE5<0:1> use the information latched by the pair of sixth latches LAT5 among the latches LAT0 to LAT7 included in the respective first and second latch groups 423_10 to 423_17, the seventh delay codes CODE6<0:1> use the information latched by the pair of seventh latches LAT6 among the latches LAT0 to LAT7 included in the respective first and second latch groups 423_10 to 423_17, and the eighth delay codes CODE7<0:1> use the information latched by the pair of eighth latches LAT7 among the latches LAT0 to LAT7 included in the respective first and second latch groups 423_10 to 423_17. The first, third, fifth and seventh delay codes CODE0<0:1>, CODE2<0:1>, CODE4<0:1> and CODE6<0:1> correspond to the first pad group DQ0, DQ2, DQ4 and DQ6 and have the same code value, and the second, fourth, sixth and eighth delay codes CODE1<0:1>, CODE3<0:1>, CODE5<0:1> and CODE7<0:1> correspond to the second pad group DQ1, DQ3, DQ5 and DQ7 and have the same code value.

In this state, the controller 300 outputs the data DATA to the semiconductor device 400 with the time interval between the pad groups. For example, the controller 300 outputs partial data through the channels corresponding to the first pad group DQ0, DQ2, DQ4 and DQ6, and, after the predetermined time interval, outputs the remaining data through the channels corresponding to the second pad group DQ1, DQ3, DQ5 and DQ7. Accordingly, the data outputted in correspondence to the first pad group DQ0, DQ2, DQ4 and DQ6 and the data outputted in correspondence to the second pad group DQ1, DQ3, DQ5 and DQ7 have different transition times.

As the data DATA are inputted through the first to eighth pads DQ0 to DQ7 with the time interval between the pad groups, the first to eighth input sections RX0 to RX7 transfer the first to eighth data INDATA<0:7> to the Internal circuits in synchronization with the first to eighth delayed clocks DCLK0 to DCLK7 with the time interval between the pad groups.

Summarizing these, in the normal mode, as the controller 300 outputs the data DATA with different transition times for the pad groups to the semiconductor device 400, the first to eighth data input/output units 410 transfer the first to eighth internal data INDATA<0:7> to the internal circuits at different times for the respective pad groups in response to the clock CLK and the first to eighth delay codes CODE0<0:1> to CODE7<0:1>.

Meanwhile, if the internal circuits output the first to eighth internal data OUTDATA<0:7> for respective pad groups sequentially, the first to eighth output sections TX0 to TX7 output the first to eighth internal data OUTDATA<0:7> to the controller 300 through the first to eighth pads DQ0 to DQ7 at different times for the respective pad groups in response to the first to eighth delayed clocks DCLK0 to DCLK7.

According to the second embodiment, when a plurality of data are simultaneously transmitted externally and internally of a semiconductor device, since the data are transmitted in such a manner that pad groups each including nonadjacent pads transmit the data to have different transition timings, crosstalk between the data may be minimized.

Although various embodiments have been described for illustrative purposes, it will be apparent to those skilled in the art that various changes and modifications may be made without departing from the spirit and scope of the invention as defined in the following claims.

For example, while it exemplarily was described in the embodiments that pads are grouped into 2 pad groups, the present invention is not necessarily limited to this and may be applied to a case where pads are grouped into three or more pad groups. However, in the case where pads are grouped into three or more pad groups, three or more latch groups should be correspondingly configured and a program operation should be performed three times or more in a program mode.

What is claimed is:

1. A semiconductor device comprising:
   a plurality of pads;
   a plurality of data input/output units coupled to the plurality of pads and enabled in response to a plurality of enable signals; and
   a group programming unit suitable for grouping the plurality of pads into a number of pad groups in response to a mode register set (MRS) code and group information, and generating a number of groups of the enable signals corresponding to the number of pad groups,
   wherein a number of groups of the data input/output units are sequentially enabled in response to respective groups of the enable signals.

2. The semiconductor device according to claim 1, wherein the group information is applied through the plurality of pads in a program mode.

3. The semiconductor device according to claim 1, wherein each of the pad groups includes non-adjacent pads among the plurality of pads.

4. The semiconductor device according to claim 3, wherein the pad groups comprise:
   a first pad group including odd-numbered pads among the plurality of pads; and
   a second pad group including even-numbered pads among the plurality of pads.

5. A semiconductor device comprising:
   a plurality of pads;
   a plurality of data input/output units one-to-one connected with the plurality of pads and enabled by a number of groups of buffer enable signals;
   a decoder suitable for decoding a predetermined mode register set (MRS) code and an address and generating a number of groups of latch enable signals and a select signal;

a number of latch groups suitable for latching different group information in response to the number of groups of the latch enable signals; and a plurality of multiplexers suitable for selecting the group information respectively latched by the number of latch groups, according to the select signal, and outputting the plurality of buffer enable signals, wherein a number of groups of the data input/output units are enabled in response to respective groups of the buffer enable signals.

6. The semiconductor device according to claim 5, wherein the group information comprises information for grouping the plurality of pads into at least two pad groups.

7. The semiconductor device according to claim 5, wherein the group information is inputted through the plurality of pads and the plurality of data input/output units in a program mode.

8. A semiconductor device comprising:
a plurality of pads;
an input circuit suitable for transferring a plurality of data inputted through the plurality of pads to internal circuits, wherein each part of the data among a number of parts of the data for respective pad groups are transferred at a different time from the other pad groups in response to delay codes and a clock; and
a group programming unit suitable for grouping the plurality of pads into a number of the pad groups in response to a mode register set (MRS) code and group information, and generating a number of groups of the delay codes corresponding to the number of groups.

9. The semiconductor device according to claim 8, wherein each part of the data are sequentially inputted with a predetermined time interval.

10. The semiconductor device according to claim 8, wherein the group information is applied through the plurality of pads and the input circuit in a program mode.

11. The semiconductor device according to claim 8, wherein each of the pad groups includes non-adjacent pads among the plurality of pads.

12. The semiconductor device according to claim 11, wherein the pad groups comprise:
a first pad group including odd-numbered pads among the plurality of pads; and
a second pad group including even-numbered pads among the plurality of pads.

13. The semiconductor device according to claim 8, wherein the input circuit comprises:
a plurality of delay sections suitable for delaying the clock by different delay times for the respective pad groups in response to the delay codes; and
a plurality of input sections suitable for transferring the plurality of data to the internal circuits in synchronization with a plurality of delayed clocks which are outputted from the plurality of delay sections.

14. The semiconductor device according to claim 13, wherein the input circuit further comprises:
a plurality of output sections suitable for outputting a number of parts of data transferred from the internal circuits, to the plurality of pads at different times for the respective pad groups in response to the plurality of delayed clocks.

15. The semiconductor device according to claim 14, wherein each part of the data transferred from the internal circuits are sequentially outputted with a predetermined time interval.

16. A semiconductor device comprising:
a plurality of pads;
a plurality of input sections suitable for transferring a plurality of data inputted through the plurality of pads, to internal circuits, wherein each part of the data among a number of parts of data for respective pad groups are transferred at a different time from the other pad groups in response to a plurality of delayed clocks;
a decoder suitable for decoding a predetermined mode register set (MRS) code and an address and generating a number of latch enable signals;
a number of latch groups suitable for latching different group information for the respective pad groups in response to the number of the latch enable signals; and
a plurality of delay sections suitable for delaying a clock by different delay times for the respective pad groups in response to respective delay codes which are outputted from the number of latch groups, and output the plurality of delayed clocks.

17. The semiconductor device according to claim 16, wherein each part of the data are sequentially inputted with a predetermined time interval.

18. The semiconductor device according to claim 16, wherein the group information comprises information for grouping the plurality of pads into at least two pad groups.

19. The semiconductor device according to claim 16, wherein the group information is inputted through the plurality of pads and the plurality of input sections in a program mode.

20. The semiconductor device according to claim 16, further comprising:
a plurality of output sections suitable for outputting a number of parts of data transferred from the internal circuits, to the plurality of pads at different times for the respective pad groups in response to the plurality of delayed clocks.

* * * * *